United States Patent [19]

Hughes

[11] Patent Number: 4,791,379
[45] Date of Patent: Dec. 13, 1988

[54] ELECTRICAL FILTER WITH ADJUSTABLE RC PRODUCT

[75] Inventor: John B. Hughes, Brighton, England

[73] Assignee: U.S. Philips Corporation, New York, N.Y.

[21] Appl. No.: 828,004

[22] Filed: Feb. 10, 1986

[30] Foreign Application Priority Data

Feb. 13, 1985 [GB] United Kingdom ............... 8503676
Nov. 29, 1985 [GB] United Kingdom ............... 8529439

[51] Int. Cl.$^4$ .......................... H03K 5/00; H03B 1/00
[52] U.S. Cl. ..................... 328/167; 328/127; 307/521
[58] Field of Search ............ 307/527, 520, 521, 269; 377/50, 28; 328/165, 167, 138, 127; 333/172; 364/724, 825

[56] References Cited

U.S. PATENT DOCUMENTS

| 4,385,242 | 5/1983 | Wagener | 307/262 |
| 4,392,068 | 7/1983 | Welles, II | 328/167 |
| 4,511,992 | 4/1985 | Dureigne et al. | 328/167 |
| 4,691,171 | 9/1987 | Van Roermund et al. | 328/167 |

Primary Examiner—Stanley D. Miller
Assistant Examiner—Timothy P. Callahan
Attorney, Agent, or Firm—Bernard Franzblau

[57] ABSTRACT

A continuous time electrical filter fabricated as an integrated circuit includes capacitors (CO,CN) and resistors (R1,R2). Since capacitors and resistors are difficult to integrate with accurately defined values a trimming circuit is provided which operates switches (S1-SN) to select appropriate ones of the capacitors (CN) to accurately define the cut-off frequency of the filter. The trimming circuit comprises a capacitor (TC2) which is charged through a resistor TR1 during a first period and which is discharged in incremental steps by a capacitor (TC1). The number of incremental steps is counted by a counter (11) and transferred to a register (13). The outputs (S1-SN) of the register control the switches (S1-SN). Instead of adjusting the value of the capacitors in the filter, the values of the resistors may be adjusted. If this is done a convenient procedure is to short out selected portions of the resistors. More than one capacitor or resistor may be adjusted using a single counter and register.

19 Claims, 7 Drawing Sheets

ELECTRICAL FILTER WITH ADJUSTABLE RC PRODUCT

BACKGROUND OF THE INVENTION

The invention relates to an integrated electrical filter comprising at least one capacitor, at least one resistor, and a trimming circuit for adjusting the value of the product of the resistance of the resistor and the capacitance of the capacitor.

Both active and passive filters may be constructed using one or more capacitors and resistors. The filters may have high pass, low pass, band pass and band stop characteristics. Low pass filters may be used as input filters for switched capacitor filters which, because they are sampled data filters, require the input signal to be band limited to prevent aliasing. Switched capacitor filters are being increasingly used due to their relative ease of integration. Similarly low pass filters are required as input filters for any signal processing circuits using sampled data techniques, e.g. other switched capacitor circuits and CCD circuits.

However, resistors and capacitors in integrated form have only a limited accuracy which prevents continuous time RC filters from having a closely defined, repeatable characteristic. Consequently it has been the general practice to use a discrete component filter in front of an integrated switched capacitor circuit or to use a much higher clock frequency which tends to increase the power dissipation. This, however, increases the cost of a system and consequently it is desirable to find a method of satisfactorily integrating a continuous time filter.

An integrated continuous time filter in which a more accurate RC time constant may be achieved is described in a paper entitled "Switched Resistor Filters. A Continuous Time Approach to Monolithic MOS Filter Design" by R. L. Geiger, P. E. Allen, and D. T. Ngo published in IEEE Transactions on Circuits and Systems, Vol. Cas-29, No. 5, May 1982, pages 306-315. This paper describes a filter in which each resistor is formed by field effect transistors (FETs) whose resistance is determined by the charge stored in, and hence the voltage across, a capacitor connected between their gate and source electrodes. Each resistor is formed by two FET's, only one being switched into the filter at a time, the other being connected in a trimming circuit which adjusts the voltage across the capacitor so that the resistance of the FET is made equal to the equivalent resistance of a switched capacitor. Thus when the FET is switched into the filter circuit the time constant of the filter capacitor and resistor depends only on the ratio between the switched capacitor and the filter capacitor and the clock frequency at which the switched capacitor is switched. When two or more capacitors are formed in a single integrated circuit it is comparatively straightforward to obtain an accurate ratio between the capacitance values. The clock frequency can also be defined accurately as it will normally be generated by an external circuit.

However, this known filter has the disadvantage that the resistance of the FETs have a non-linear relationship to the control voltage and this gives rise to inaccuracies in the resistance values. Also the resistances of different FETs for equal gate-source voltages are found to vary significantly due to differences in the voltages on the drain electrodes and on the back gates. Since the resistance of the FET is influenced by the source drain voltage, the input signal will cause modulation of the FET resistance thus varying the filter characteristics with input signal amplitude. Further the use of two FETs for each resistor, only one of which is used at any instant, may give rise to crosstalk between the clock signals used for switching.

SUMMARY OF THE INVENTION

It is an object of the invention to enable the provision of a filter as set forth in the opening paragraph in which a different approach to the problem of compensating for the spread in values of capacitance and resistance in integrated filters can be adopted which enables the effects of some of the disadvantages of the known filter to be mitigated.

The invention provides an integrated electrical filter as set forth in the opening paragraph characterised in that, the trimming circuit comprises means for charging a further capacitor from a reference voltage source through a further resistor for a first period, means for removing the charge from the further capacitor in discrete increments during a second period, means for counting the number of increments required to remove the charge accumulated on the further capacitor during the first period, and means for adjusting the value of said at least one capacitor or said at least one resistor in dependence on the number of increments counted.

A filter according to the invention has the advantage that the value of real resistors or capacitors is adjusted, thus avoiding the problems associated with the non-linear response of the FETs.

The first period may be equal to $2^N$ periods of a clock signal, where N is an integer and the second period may be equal to $2^N + P$ periods of the clock signal, where P is an integer.

The means for counting the number of increments may be a binary counter which is incremented by said clock signal. The further capacitor may form part of an integrator and the output of the integrator may be arranged to cause the output of the counter to be read into a register when the charge has been removed from the further capacitor. Alternatively the output of the integrator may be arranged to inhibit further counting of the clock signal by the counter.

Said at least one capacitor may comprise a first capacitor and N associated capacitors, each of the N associated capacitors being connected in parallel with the first capacitor via an associated switch, the associated switches being controlled by the counting means.

Said at least one resistor may comprise a first resistor and N associated resistors, each of the N associated resistors having an associated switch to enable it to be selectively connected in series with the first resistor, the associated switches being controlled by the counting means.

The means for removing the charge from the further capacitor may comprise a switched capacitor which is charged from said reference voltage source in a first part of each cycle of a clock signal and whose charge is transferred to the further capacitor in a second part of each cycle of the clock signal, the first and second parts being non-overlapping.

The filter may further comprise means for comparing the current state of the counting means with that stored in the register in the previous cycle, means for comparing the voltage across the further capacitor with a first reference voltage when the current state of the counting means is not equal to that stored in the register, and means for comparing the voltage across the further capacitor with a second reference voltage when the current state of the counting means is equal to that stored in the register.

This has the advantage of enabling the provision of a hysteresis effect which reduces the effect of noise on the increment count obtained and thus reduces the possibility of switching the characteristics on the occurrence of noise.

The integrator may comprise a differential amplifier whose offset voltage is switched in sign between the first and second periods.

This enables the provision of an offset cancelling arrangement which reduces the effect of offsets in the amplifier on the adjustment of the capacitors or resistors of the filter.

BRIEF DESCRIPTION OF THE DRAWINGS

Embodiments of the invention will now be described, by way of example, with reference to the accompanying drawings, in which.

DESCRIPTION OF THE PREFERRED EMBODIMENTS

Figure 1:
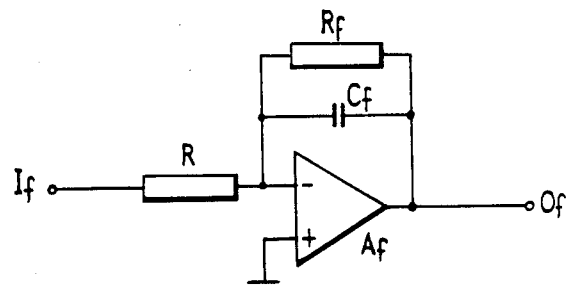
FIG. 1 shows a known first order active low pass filter.

FIG. 1 shows a simple first order active filter having an input $I_f$ which is connected through a resistor $R_i$ to the junction of the inverting input of a differential amplifier $A_f$, a capacitor $C_f$, and a resistor $R_f$. An output $O_f$ of the filter is connected to the junction of the output of the differential amplifier $A_f$, the capacitor $C_f$ and the resistor $R_f$. The non-inverting input of the differential amplifier $A_f$ is connected to ground. The filter shown is a well known conventional active filter and its response is given by $$H_{(s)} = -\frac{A}{1 + s/w_{co}}$$

where $w_{co}$ (The $-3$ dB cut-off frequency of the filter) $= 1/R_f C_f$

Clearly any spreads in the value of $R_f$ and $C_f$ will directly affect the cut-off frequency. It is well known that it is difficult to fabricate integrated resistors and capacitors accurately and consequently where an accurately specified cut-off frequency is required it has been common practice to use discrete component filters.

The filter referred to in the introduction has sought to overcome this problem by making a controlled adjustment of the resistance values in the filter. The arrangement shown in FIG. 2 allows a controlled adjustment of the capacitance values or if suitable modifications are made the resistance values.

Figure 2:
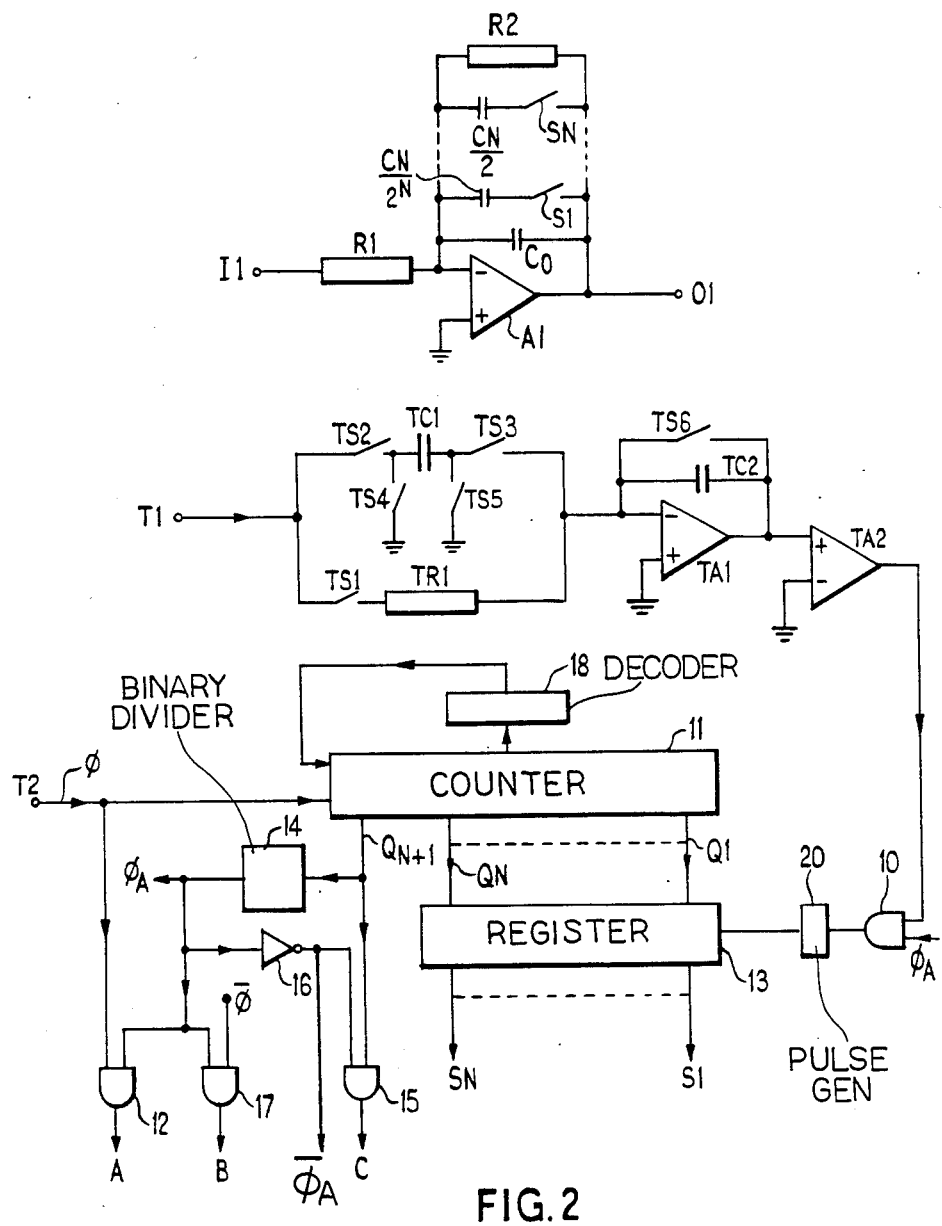
FIG. 2 shows a first embodiment of a first order active low pass filter according to the invention.

As shown in FIG. 2 a first order active filter comprises an input I1 which is connected via a resistor R1 to the junction of the inverting input of a differential amplifier A1, a resistor R2, a capacitor C0, and to N series arrangements of a capacitor CN and a switch SN, where N is an integer which is chosen to give the desired precision of cut-off frequency. The other end of the resistor R2, the series arrangements of capacitors CN and switches SN, and the capacitor C0 are connected to the junction of the output of the differential amplifier A1 and an output terminal O1. The non-inverting input of the differential amplifier A1 is connected to ground.

This arrangement forms a first order active low pass filter. The capacitors CN have binary weighted values and can be selectively connected in parallel with capacitor C0 by means of the switches S1 to SN, which switches are controlled, as described hereinafter, to be operated in such a manner as to closely define the cut-off frequency of the filter.

The rest of the circuit forms a trimming circuit for adjustment of the value of the filter capacitance by providing appropriate signals for controlling the operation of the switches S1 to SN. A terminal T1, to which, in operation, a reference voltage source is connected, is connected via a first switch TS1 to one end of a resistor TR1, the other end of which is connected to the inverting input of a differential amplifier TA1. The terminal T1 is also connected via a second switch TS2 to one plate of a capacitor TC1 whose other plate is connected via a switch TS3 to the inverting input of the amplifier TA1. A switch TS4 is connected between ground and the junction of the switch TS2 and the capacitor TC1, while a switch TS5 is connected between ground and the junction of the capacitor TC1 and the switch TS3. The non-inverting input of the amplifier TA1 is also connected to ground while its output is connected via the parallel arrangement of a capacitor TC2 and a switch TS6 to its inverting input. The output of the amplifier TA1 is connected to the non-inverting input of a differential amplifier TA2 whose inverting input is connected to ground. The output of the amplifier TA2 is connected to a first input of an AND gate 10. The amplifier TA2 forms an analogue comparator. A terminal T2 which, in operation receives a clock signal, is connected to a clock input of a counter 11 and to a first input of an AND gate 12. The counter 11 has N parallel outputs Q1–QN which are connected to corresponding inputs of an N bit register 13. The counter 11 has a further output $Q_{N+1}$ which is connected to the clock input of a binary divider 14 and to a first input of an AND gate 15. The output of the divider 14 is connected to the input of an inverter 16 that provides an output $\overline{\phi}_A$ to a second input of the AND gate 15, to a second input of the AND gate 12. The output of divider 14 is also connected to a first input of an AND gate 17, and via a line $\phi_A$ to a second input of the AND gate 10. An inverted version of the clock signal applied to the terminal T2 is applied to a second input of AND gate 17. The outputs of AND gates 12, 17 and 15 on lines A, B, and C, respectively control the operation of switches TS2 and TS5; TS3 and TS4; and TS6, respectively. The output of inverter 16 provides a signal on line $\overline{\phi}_A$ which controls the operation of switch TS1. The outputs of the N bit register 13 on lines S1 to SN control the corresponding switches S1 to SN in the filter. The output of AND gate 10 is connected to the input of a pulse generator 20 whose output is connected to a load input of the N bit register 13 while a decoding circuit 18 decodes the output of the counter 11 and provides a reset signal for the counter 11 when a count of $2^N+P$ is decoded, as will be described hereinafter.

The operation of the arrangement will now be described with reference additionally to the waveforms shown in FIG. 3 and the characteristic shown in FIG. 4. Since the filter and trimming circuit are integrated together it can be arranged that the ratios of the capacitances of capacitors C0, CN, TC1 and TC2 are accurately defined as are the ratios of resistors TR1 and R2.

A reference voltage V, which may for example be the chip power supply voltage, is applied to terminal T1 while a clock signal $\phi$ is applied to terminal T2. At time $t_1$ the signal $\phi_A$ closes the switch TS1 and the signal C closes the switch TS6. Consequently capacitor TC2 is shorted and the voltage (v) at the output of amplifier TA1 is equal to 0V. At time $t_2$ the switch TS6 is opened and switches TS2 to TS5 are also open so that the capacitor TC1 is left floating. The interval between $t_1$ and $t_2$ is arbitrary but for convenience is set to P cycles of the clock signal $\phi$. Between times $t_2$ and $t_3$ capacitor TC2 integrates the current $I=V/TR1$ to produce a negatively going ramp. The interval between times $t_2$ and $t_3$ is arbitrary but for convenience is set to $2^N$ cycles of the clock signal $\phi$. The value of the ramp at time $t_3$ is therefore given by $$v = \frac{1}{Co} \int_{t_2}^{t_3} Idt = -\frac{V(t_3 - t_2)}{R \cdot Co} = -\frac{V \cdot 2^N \Omega}{fc} \quad (1)$$

where
Co is the capacitance of capacitor TC2,
R is the resistance of resistor TR1,
fc is the frequency of the clock signal $\phi$, and
$\Omega$ is a characteristic frequency 1/Rco.

At time $t_3$ switch TS1 is opened and switches TS2, TS3, TS4, and TS5 are controlled by waveforms A and B which between times $t_3$ and $t_5$ are complementary to each other and change at the clock frequency fc. Consequently capacitor TC2 integrates the current from capacitor TC1 to produce a positively going staircase. Each increment in v is given by $$\delta v = V \cdot \frac{C1}{CO} \quad (2)$$

where C1 is the capacitance of capacitor TC1.

At time $t_4$ which is P cycles of the clock signal after time $t_3$ the counter 11 is reset. Capacitor TC2 continues to integrate current from capacitor TC1 and when the staircase crosses zero, i.e. v=0, AND gate 10 produces a signal which causes the pulse generator 20 to produce a short pulse to load the output of the counter into the N bit register 13. The pulse generator 20 is constructed to produce a short pulse in response to the signal transition from false to true at the output of the AND gate 10 and may be a monostable multivibrator or could alternatively be formed from clocked bistable circuits. The outputs S1 to SN of this register then control the switches S1 to SN of the filter to produce a more accurately defined cut-off frequency.

At time $t_5$ the $Q_{N+1}$ output of the counter 11 causes the signal $\phi_A$ to change state and the procedure to be repeated.

Figure 4:
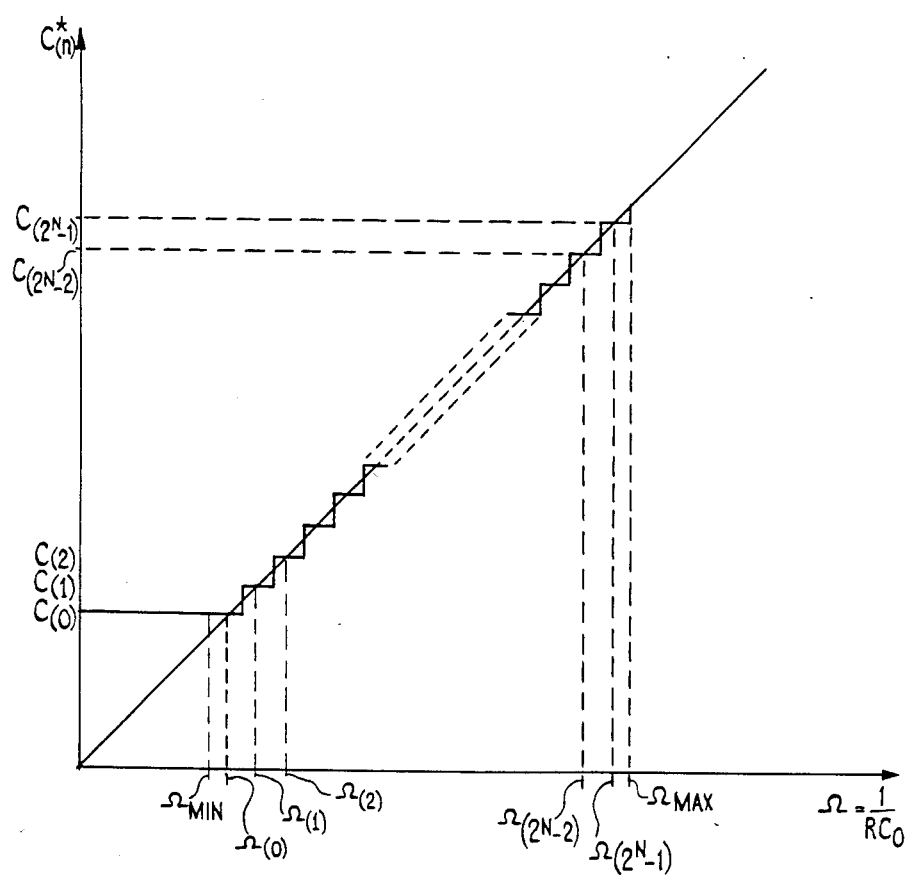
FIG. 4 shows a discrete approximation to the ideal compensation characteristic for the filter of FIG. 2.

FIG. 4 shows the discrete approximation to the ideal compensation characteristic covering a spread in characteristic frequency $\Omega$ for the range $\Omega_{MIN} \leq \Omega \leq \Omega_{MAX}$.

Figure 3:
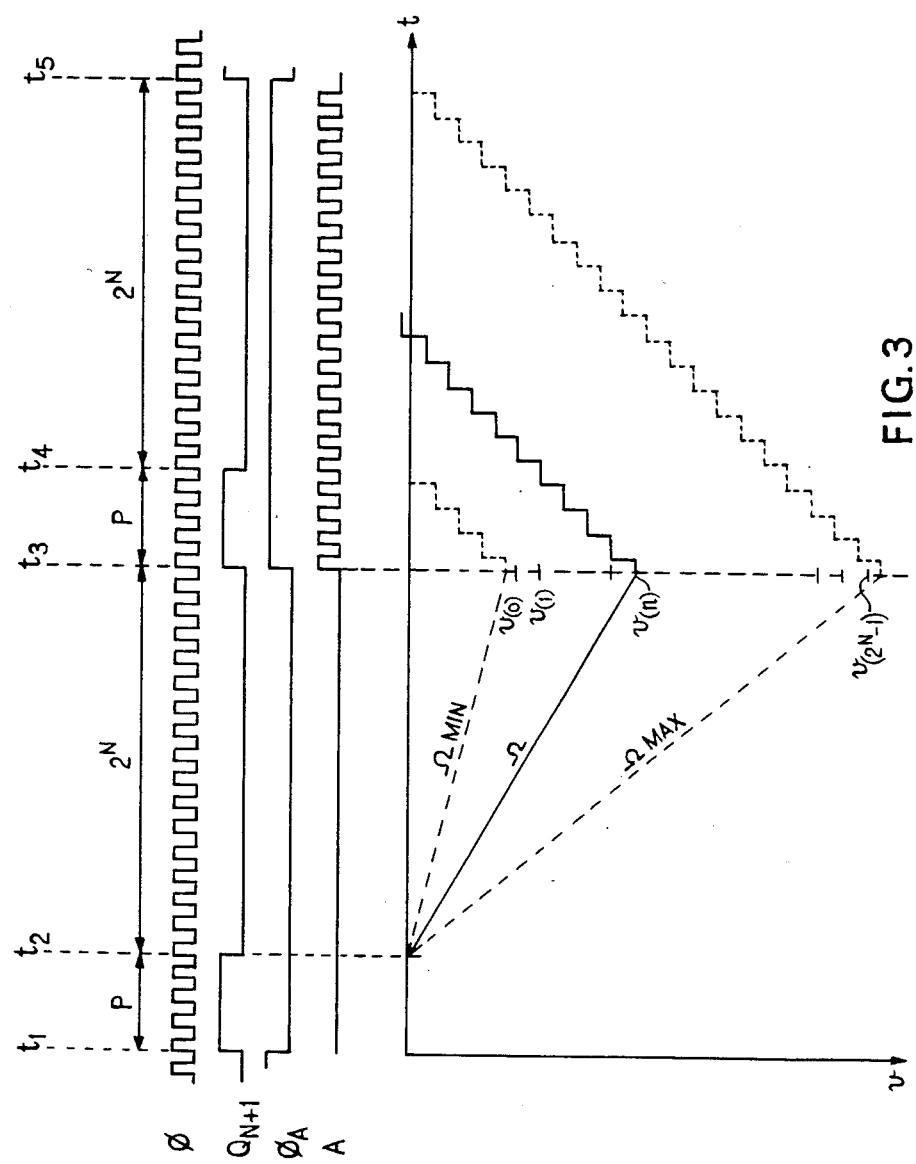
FIG. 3 shows various waveforms in the filter of FIG. 2.

As shown in FIGS. 3 and 4 $\Omega_{MIN}$ and $\Omega_{MAX}$ are the limiting values of $\Omega$ which can be compensated by the arrangement shown in FIG. 2. When $\Omega = \Omega_{MIN}$ it takes P cycles of the clock signal $\phi$ to increase v to zero. When $\Omega = \Omega_{MAX}$ it takes $P + 2^N$ cycles of the clock signal $\phi$ to increase v to zero.

$$\text{therefore } \frac{\Omega MAX}{\Omega MIN} = \frac{P + 2^N}{P} = 1 + \frac{2^N}{P} \quad (3)$$

The approximate characteristic coincides with the ideal characteristic at $2^N$ points, i.e. at frequencies defined by (n) where $0 \leq n \leq 2^N - 1$.

$$\text{and } \Omega_{(n)} = \Omega_{MIN} + \frac{(n + \frac{1}{2})(\Omega_{MAX} - \Omega_{MIN})}{2^N}$$

$$= \Omega_{MIN} + \frac{(n + \frac{1}{2})\left(\frac{\Omega_{MAX}}{\Omega_{MIN}} - 1\right)\Omega_{MIN}}{2^N}$$

Subs. for $\Omega_{MAX}/\Omega_{MIN}$ from ... (3)

$$\Omega_{(n)} = \Omega_{MIN} + \frac{(n + \frac{1}{2})\left(1 + \frac{2^N}{P} - 1\right)\Omega_{MIN}}{2^N} \quad (4)$$

$$= \Omega_{MIN}\left(1 + \frac{n + \frac{1}{2}}{P}\right)$$

The term $n + \frac{1}{2}$ from a $\frac{1}{2} \delta v$ offset used to minimise the deviation between the ideal and discrete characteristics.

From equation (1) the integrator output voltage at time $t_3$ is given by $$v_{(n)} = \frac{-V \cdot 2^N}{fc} \Omega_{(n)}$$

substituting for $\Omega_{(n)}$ from (4)

$$v_{(n)} = \frac{-V \cdot 2^N}{fc} \Omega_{MIN}\left(1 + \frac{n + \frac{1}{2}}{P}\right)$$

m cycles of the clock signal $\phi$ after time $t_3$ the integrator output voltage is $V_{(m)} = V_{(n)} + m \cdot \delta V$ After a further $m_{(n)}$ cycles of the clock signal $\phi$ after time $t_3$ the integrator output voltage for $\Omega_{(n)}$ reaches $+\delta V/2$ and the counter state is loaded into the register $$M_{(n)} = \frac{\frac{\delta v}{2} - v_{(n)}}{m_{(o)} = P + 1} \quad (6)$$

For $n = 0$

From (6)

$$m_{(o)} = P + 1 = \tfrac{1}{2} \cdot \frac{v_{(o)}}{\delta v}$$

therefore $$\delta v = \frac{-v_{(o)}}{P + \tfrac{1}{2}}$$

Substituting for $v_{(n)}$ from (5) and putting $n = 0$ gives $$\delta v = \frac{V}{P + \tfrac{1}{2}} \cdot \frac{2^N}{fc} \cdot \Omega_{MIN} \left(1 + \frac{n + \tfrac{1}{2}}{P}\right) \quad (7)$$

$$= \frac{V \cdot 2^N}{P \cdot fc} \Omega_{MIN}$$

Substituting for $v_{(n)}$ from (5) and $\delta v$ from (7) in (6) gives $$m_{(n)} = \tfrac{1}{2} + \frac{\dfrac{V \cdot 2^N}{fc} \Omega_{MIN}\left(1 + \dfrac{n + \tfrac{1}{2}}{P}\right)}{\dfrac{V}{P} \cdot \dfrac{2^N}{fc} \Omega_{MIN}}$$

$$= \tfrac{1}{2} + \left(1 + \frac{n + \tfrac{1}{2}}{P}\right) P$$

$$= (P + 1) + n$$

therefore $m_{(n)} = m_{(o)} + n$ \quad (8)

Equation (8) shows that for processing characteristic $\Omega_{(n)}$ it takes $n$ more cycles of the clock signal frequency $\phi$ for the output voltage $v$ of the amplifier TS1 to reach $+\delta v/2$ volts. In other words the arrangement has measured $\Omega_{(n)}$. The counter state $n$ is used to program the capacitor array (C0+CN) written hereinafter as C*(n) which is designed to produce the desired cut-off frequency $W^*_{CO}$.

The capacitor array is designed to give $$C^*_{(n)} = \frac{C^*}{2^N}(P + n + \tfrac{1}{2}) \quad (9)$$

where the capacitance value of capacitor $$CO = \frac{C^*}{2^N}(P + \tfrac{1}{2})$$

and the capacitance value of capacitors $$CN = \frac{C^*}{2^N} \cdot n$$

$$\therefore w^*_{(n)} = \frac{1}{R^* C^*_{(n)}}$$

where $R^*$ is the resistance of resistor R2

$$\therefore w^*_{(n)} = \frac{2^N w^*}{P + n + \tfrac{1}{2}} \quad (10)$$

where $w^* = \dfrac{1}{R^* C^*}$

From (4)

$$n = P\left(\frac{\Omega_{(n)}}{\Omega_{MIN}} - 1\right) - \tfrac{1}{2} \quad (11)$$

$$\therefore w^*_{(n)} = \frac{2^N \cdot w^*}{P\left(\dfrac{\Omega_{(n)}}{\Omega_{MIN}}\right)}$$

Note that $$w^* = \frac{1}{R^* C^*}$$

varies with processing spreads so $w^*_{MIN} \leqq w^* \leqq w^*_{MAX}$ and $w^*_{NOM} = \dfrac{w^*_{MIN} + w^*_{MAX}}{2}$ Now $$w^* = w^*_{NOM} \times \frac{w^*}{w^*_{NOM}} = w^*_{NOM} \times \left(\frac{\Omega}{\Omega_{NOM}}\right) \quad (12)$$

where $\Omega_{NOM} = \dfrac{\Omega_{MIN} + \Omega_{MAX}}{2} = \dfrac{\Omega_{MIN}}{2}\left(1 + \dfrac{\Omega_{MAX}}{\Omega_{MIN}}\right)$ $$\therefore \frac{\Omega_{NOM}}{\Omega_{MIN}} = 1 + \frac{2^{N-1}}{P} \quad (13)$$

From (12)

$$w^* = w^*_{NOM}\left(\frac{\Omega}{\Omega_{MIN}}\right) \cdot \left(\frac{\Omega_{MIN}}{\Omega_{NOM}}\right)$$

Substituting (13) in (12)

$$w^* = \frac{w^*_{NOM}}{1 + 2^{N-1}}\left(\frac{\Omega}{\Omega_{MIN}}\right) \quad (14)$$

$$\therefore \frac{w^*}{\dfrac{\Omega}{\Omega_{MIN}}} = \frac{w^*_{NOM}}{1 + \dfrac{2^{N-1}}{P}}$$

Substituting (14) in (11)

$$w^*_{(n)} = \frac{2^N w^*_{NOM}}{P\left(1 + \dfrac{2^{N-1}}{P}\right)} \quad (15)$$

i.e. $w^*_{(n)} = w^*_{CO} = \dfrac{2^N}{(R^* C^*)_{NOM}(P + 2^{N-1})}$

From (7)

$$\delta v = \frac{V \cdot 2^N}{P \cdot fc} \cdot \Omega_{MIN}$$

also $\delta v = V\left(\dfrac{C1}{Co}\right)$ $$\therefore \Omega_{MIN} = P \cdot \frac{fc}{2^N}\left(\frac{C1}{Co}\right)$$

From (13)

$$\Omega_{NOM} = \Omega_{MIN}\left(\frac{\Omega_{NOM}}{\Omega_{MIN}}\right) = P \cdot \frac{fc}{2^N}\left(\frac{C1}{Co}\right)\left(1 + \frac{2^{N-1}}{P}\right) \quad (16)$$

i.e. $\frac{1}{(RCo)_{NOM}} = \frac{fc}{2^N}\left(\frac{C1}{Co}\right)(P + 2^{N-1})$ $$\therefore (RC1)_{NOM} = \frac{2^N}{fc(P + 2^{N-1})} = (R^*C^*)_{NOM} \cdot \frac{w^*_{co}}{fc}$$

since from (15)

$$\frac{2^N}{P + 2^{N-1}} = (R^*C^*)_{NOM} w^*_{co} \quad (17)$$

$$\therefore w^*_{co} = fc\left(\frac{R}{R^*}\right)\left(\frac{C1}{C^*}\right)$$

Equations (15) and (17) show that the filter cut-off frequency $w^*_{co}$ is independent of n. That is for a complete set of processing conditions defined by $\Omega_{(n)}$ for $0 \leq n \leq 2^{N-1}$ the filter cut off frequency is unchanged and depends only on the clock signal frequency $f_c$ and the ratios of the integrated capacitors and resistors. These parameters can all be accurately reproduced.

The value of the capacitance Co of capacitor TC2 does not influence the performance of the trimming circuit and need only be chosen to limit the voltage excursion at the output of the integrator, i.e. to prevent saturation of the amplifier TA1.

The maximum voltage at the output of the integrator is given by $$v_{MAX} = (2^N + P)\delta v \quad (18)$$
$$= (2^N + P) \cdot V \cdot \left(\frac{C1}{Co}\right)$$

$$\therefore Co = (2^N + P) \cdot \frac{V \cdot C1}{v_{MAX}}$$

The quantization error, E, can be expressed as the peak error between the ideal and quantized characteristics shown in FIG. 4

$$\therefore E = \pm \frac{\Omega_{(n+1)} - \Omega_{(n)}}{\Omega_{(n+1)} + \Omega_{(n)}} \times 100\%$$

From (4)

$$E = \pm \frac{\Omega_{MIN}\left(1 + \frac{n + 3/2}{P}\right) - \Omega_{MIN}\left(1 + \frac{n + 1/2}{P}\right)}{\Omega_{MIN}\left(1 + \frac{n + 3/2}{P}\right) + \Omega_{MIN}\left(1 + \frac{n + 1/2}{P}\right)} \times 100\%$$

$$= \pm \frac{100}{2P + 2n + 2}\%$$

This is a maximum when n=0

$$\therefore E_{MAX} = \pm \frac{50}{P + 1}\% \quad (19)$$

The range of cut-off frequencies produced by processing spreads which can be compensated for can be expressed as S where $$S = \pm \frac{\Omega_{MAX} - \Omega_{MIN}}{\Omega_{MAX} + \Omega_{MIN}} \times 100\% \quad (20)$$

$$= \pm \frac{100}{1 + \frac{P}{2^{N-1}}}\%$$

Equations (19) and (20) illustrate how a filter having an uncompensated spread S can be improved to give a compensated spread given by $E_{MAX}$.

Table 1 shows uncompensated (U) and compensated (C) spreads in filter cut-off frequency for various values of N and P.

TABLE I

| N | 3 | | 4 | | 5 | | 6 | |
|---|---|---|---|---|---|---|---|---|
| P | U | C | U | C | U | C | U | C |
| $2^N$ | ±33% | ±5.5% | ±33% | ±2.94% | ±33% | ±1.5% | ±33% | ±0.76% |
| $2^{N-1}$ | ±50% | ±10% | ±50% | ±5.5% | ±50% | ±2.94% | ±50% | ±1.5% |
| $2^{N-2}$ | ±67% | ±16.6% | ±67% | ±10% | ±67% | ±5.5% | ±67% | ±2.94% |

EXAMPLE

Assume that $$S = \pm 50\%, \quad (1)$$

$$E_{MAX} \leq 3\%. \quad (2)$$

$$f^*_{co} = 80 \text{ KHz, and} \quad (3)$$

$$fc = 160 \text{ KHz}. \quad (4)$$

From Table 1 choose N=5 P=$2^{N-1}$=16.
From (15)

$$(R^*C^*)_{NOM} = \frac{1}{2\pi \cdot 80 \cdot 10^3} \cdot \frac{32}{16 + 16} = 1.989 \cdot 10^{-6}$$

-continued for $C^*_{NOM} = 16pF; R^*_{NOM} = \frac{1.989 \cdot 10^{-6}}{16 \cdot 10^{-12}} = 0.124M\Omega$ From (16)

Figure 5:
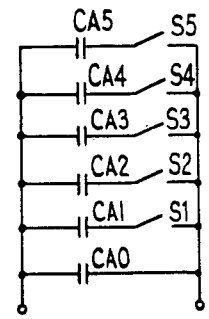
FIG. 5 shows a capacitor network illustrating a practical compensation example.

$(RC1)_{NOM} = .989 \cdot 10^{-6} \cdot \frac{2\pi \cdot 80 \cdot 10^3}{160 \cdot 10^3} = 6.25 \cdot 10^{-6}$ for $C1_{NOM} = 16pF; R = \frac{6.25 \cdot 10^{-6}}{16 \cdot 10^{-12}} = 0.39M\Omega$ The values of the capacitors in the capacitor array shown in FIG. 5 are then as follows:

$CA0 = 8.25$ pF $CA1 = 0.5$ pF $CA2 = 1.0$ pF $CA3 = 2.0$ pF $CA4 = 4.0$ pF $CA5 = 8.0$ pF

If, in a given circuit, the counted increments $n = 26$ then the value of $$\begin{aligned} C^*_{(n)} &= \frac{C^*}{2^N}(P + n + \tfrac{1}{2}) \\ &= \frac{16}{2^5}(16 + 26 + \tfrac{1}{2}) \\ &= \frac{16}{32} \cdot 42.5 \\ &= 20.25 pF. \end{aligned}$$

The counter output n in binary form is 11010 and hence switches 55, 54, and 52 are made and the capacitor array connected across the amplifier A1 comprises capacitors CA5, CA4, CA2 and CA0 whose total capacitance is 20.25 pF.

Figure 6:
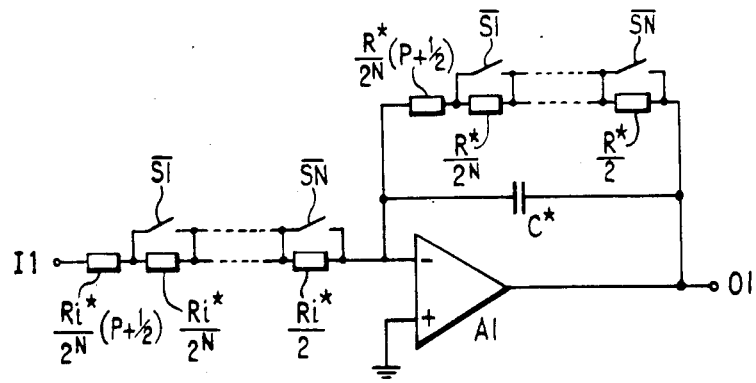
FIG. 6 shows a second embodiment of a first order active low pass filter according to the invention.

FIG. 6 shows a first order filter in which the resistors are adjustable instead of the capacitor. This may have advantages when higher order filters are desired since they do not always have solutions with equal valued capacitors but normally do have solutions with equal valued resistors. The programming is made easier if all the values are the same. It should be noted that although in theory the corrections for unequal valued capacitors are the same, i.e. the capacitance ratios remain constant, the difference in value between the lowest and highest required values becomes unwieldy and makes them difficult to fabricate.

With a first order filter as shown in FIGS. 1 and 6 there are advantages in using a capacitor array in that only one capacitor needs adjustment. When the adjustment is applied to the resistance values it is desirable to adjust both $R_i$ and $R_f$ in order to keep the gain constant. The arrangement shown in FIG. 6 uses the same trimming circuit as that of FIG. 2. However, since opening the switches S1 to SN increases the resistance, inverted values from the shift register 13 should be used to control the switches or the switches themselves should operate with signals of opposite polarity. With higher order filters the number of resistors and capacitors tends to be more nearly equal and hence there is no significant difference in the number of switches required. The number of components (resistors or capacitors) which can be adjusted using a single trimming circuit is limited only by the number of switches which can be controlled from a single register output. This can be increased if desired by using the register outputs to drive multiple driving circuits.

Various modifications may be made to the trimming circuit. For example, instead of using the output of the comparator TA2 to load the N bit register 13 with the counter state, it would be possible to stop the counter cycling at that time and use the counter outputs directly to control the switches S1 to SN. The advantage of the arrangement shown in FIG. 2 is that it compensates for long term drift due to ageing and temperature variations.

If the processing spreads are outside the limits of correction set by the chosen value of N and P it is possible for an inappropriate correction to be made. For example when the value is less than $\Omega_{MIN}$ the counter 11 will not have been reset before v crosses zero and hence the switches will be programmed for a setting appropriate to spread at the opposite end of the scale. Since this is outside the designed for tolerance it could be considered that the circuit is faulty and should be discarded in any case. However, an alternative approach is to set the switches to the state equivalent to $\Omega_{MIN}$ in this case. This may be achieved by detecting that the zero crossing of v occurs between times $t_3$ and $t_4$, i.e. during the pulse $Q_{N+1}$ and using this information to force the counter state to zero. A similar situation occurs at the other end of the processing spread $\Omega_{MAX}$. In this event it can be detected that v does not reach zero before $t_5$. In which case the counter is forced to the maximum count so that the switches S1 to SN are selected to give a correction appropriate to $\Omega_{MAX}$.

An alternative to the trimming circuit described is to transfer a charge from a further capacitor to the capacitor TC2 in a first period and to discharge the capacitor TC2 through a resistor in a second period. A counter is started at the beginning of the second period and stopped when the capacitor TC2 is discharged, i.e. $v = 0$. The state of the counter again programmes the switches S1 to SN. Again the count reached by the counter will depend on the processing spreads, the total charge transferred and hence the discharge time is representative of the absolute capacitance and resistance values.

Figure 7:
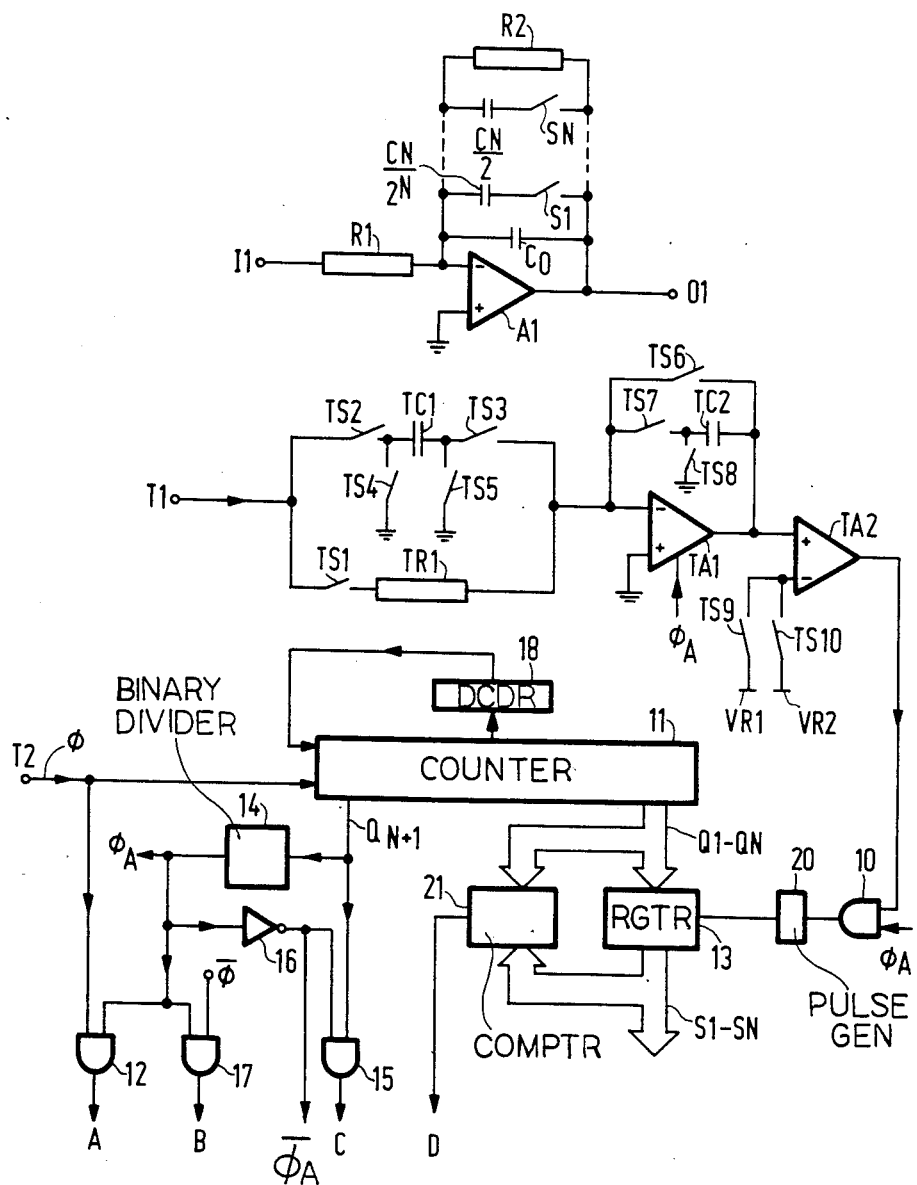
FIG. 7 shows a third embodiment of a first order active low pass filter according to the invention.
Figure 9:
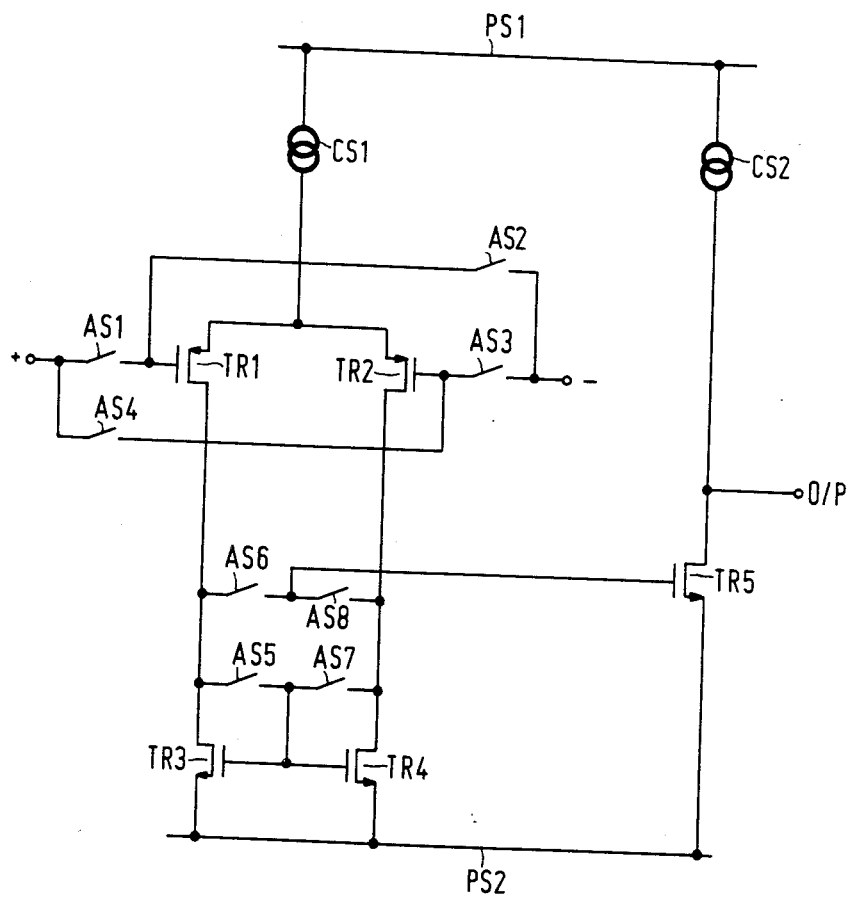
FIG. 9 shows an embodiment of an operational amplifier for use in the trimming circuit of FIG. 7.

FIG. 7 shows a third embodiment of a first order active low pass filter which is a modified version of that shown in FIG. 2. Equivalent elements in FIG. 7 have been given the same reference numerals as those in FIG. 2. Only the changes from the embodiment shown in FIG. 2 and described with reference thereto will be described in detail hereinafter. The differential amplifier TA1, an example of which is shown in FIG. 9, is provided with a further input which is fed with the signal $\phi_A$. This signal causes the amplifier TA1 to be internally re-arranged at the clock-frequency of the signal $\phi_A$ and this is used to cancel the effects of voltage offsets at its input. A switch TS7 is connected between the inverting input of amplifier TA1 and the capacitor TC2, while a switch TS8 is connected between ground and the junction of the capacitor TC2 and the switch TS7.

The analogue comparator TA2 has been modified by connecting its inverting input to two reference voltage sources VR1 and VR2 via respective switches TS9 and TS10. The counter outputs Q1–QN are connected to a first set of inputs of a digital comparator 21 in addition to the inputs of the register 13 while the outputs S1–SN of the register 13 are additionally connected to a second set of inputs of the digital comparator 21. The output D of the digital comparator 21 is used to control the operation of the switches TS9 and TS10.

The digital comparator 21, switches TS9 and TS10 and reference voltage sources VR1 and VR2 form a hysteresis circuit which reduces the tendency of the programming outputs S1–SN to change due to noise on the signal applied to the amplifier TA1. The voltage VR1 may be +5 mV and the voltage VR2 −5 mV, the switch TS9 being operated when the comparator 21 does not detect equality, and the switch TS10 when the comparator 21 detects equality. In this way noise on the incremental charges fed to capacitor TC2 and noise at the output of amplifier TA1 are both less likely to affect the point at which the amplifier TA2 detects that the charge on capacitor TC2 has been reduced to zero, since on the step before the expected increment the reference voltage is +5 mV rather than ground and on the step of the expected increment the reference voltage is −5 mV. In this context the expected increment is the increment corresponding to the increment which produced zero charge on capacitor TC2 during the previous cycle, i.e. the increment number stored in the register 13. This means that a peak noise level of 5 mV can be superimposed on the step before the expected increment without a false change of programming count. The levels mentioned are given only as an example, the actual level used will depend on the step size and the noise immunity required in a particular embodiment.

The switches TS7 and TS8 are used to cancel offsets in the amplifier TA1 using the property of the amplifier TA1 that its offset voltage is reversible by means of the further input fed with the signal $\phi_A$. From time $t_1$ to $t_2$ the switches TS6 and TS8 are closed and TS7 is open. Consequently the capacitor TC2 is precharged to the offset voltage x produced by the amplifier TA1. From time $t_2$ to $t_3$ switch TS7 is closed and switches TS6 and TS8 are open. The output voltage v of the amplifier TA1 goes initially to 2x and then changes negatively. After $2^N$ periods of the clock A the voltage at the output of the amplifier TA1

$$v = 2x - 2^N(V-x)/f_c R_o C_o$$

and the voltage across the capacitor $$V_c = x - 2^N(V-x)/f_c R_o C_o$$

From time $t_3$ to $t_5$ capacitor TC1 charges to +V on A and discharges to −x on $\overline{A}$.

$$\delta v_o(\text{step size}) = (V-x)C1/C2$$

The capacitor TC1 discharges to −x because the offset on the amplifier has been reversed by application of the signal $\phi_A$ to its further input.

After n increments the outputs of the amplifier TA1

$$\begin{aligned} v &= V_c - x + n\delta v_o \\ &= x - 2^N(V-x)/f_c \cdot R_o C_o - x + n(V-x)C1/C2 \\ &= -(V-x)(2^N/f_c R_o C_o - nC1/C2) \end{aligned}$$

and thus the performance in insensitive to offsets.

Figure 8:
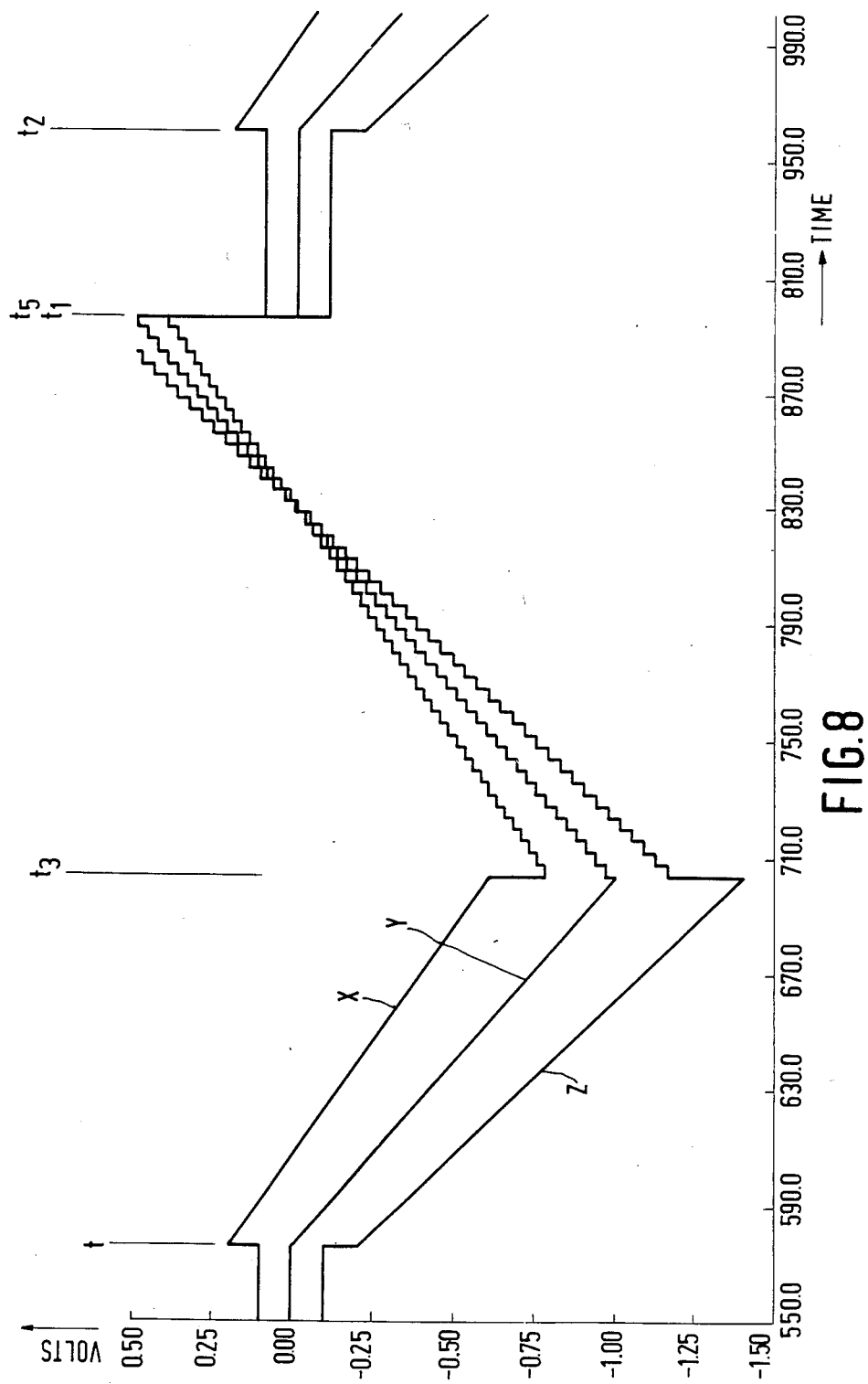
FIG. 8 shows various waveforms in the embodiment shown in FIG. 7.

FIG. 8 shows the effect of this arrangement on the output of the amplifier TA1 with zero offset (waveform Y), +100 mV offset (waveform X), and −100 mV offset (waveform Z). It can be seen from FIG. 8 that all the waveforms cross at an output voltage of zero regardless of the offset voltage. It can also be seen that the magnitude of the incremental steps varies with the offset.

FIG. 9 shows an embodiment of an amplifier suitable for use as the amplifier TA1. The amplifier shown in FIG. 9 comprises two FETs having their source electrodes coupled through a current source CS1 to a first power supply rail PS1. The gate electrode of TR1 is connected via a switch AS1 to the non inverting input (+) of the amplifier and via a switch AS2 to the inverting input (−) of the amplifier. The gate electrode of TR2 is connected via a switch AS3 to the inverting input of the amplifier and via a switch AS4 to the non-inverting input of the amplifier. The drain electrode of TR1 is connected to the drain electrode of an FET TR3, to the gate electrodes of an FET TR4 and the FET TR3 via a switch AS5, and to the gate electrode of an FET TR5 via a switch AS6. The drain electrode of TR2 is connected to the drain electrode of TR4, to the gate electrodes of TR3 and TR4 via a switch AS7, and to the gate electrode of TR5 via a switch AS8. The source electrode of TR5 is connected to the power rail PS1 via a current source CS2. The source electrodes of TR3 and TR4 and the drain electrode of TR5 are connected to a second power supply rail PS2. The output of the amplifier is taken from the junction of TR5 and CS2.

In operation, during the period $t_1$ to $t_3$ switches AS1, AS3, AS5 and AS8 are made and switches AS2, AS4, AS6 and AS7 are open. Consequently the non-inverting input (+) is connected to TR1, TR3 forms the diode of the current mirror comprising TR3 and TR4, and the output is taken from the drain of TR4. During the period $t_3$ to $t_5$ switches AS1, AS3, AS5 and AS8 are open and switches AS2, AS4, AS6 and AS7 are closed. Consequently the non-inverting input (+) is connected to TR2, TR4 forms the diode of the current mirror comprising TR3 and TR4, and the output is taken from the drain of TR3. Since the positions of TR1 and TR2 are interchanged and the positions of TR3 and TR4 are also interchanged any offsets will be of equal magnitude but opposite sign. Thus this amplifier may be used in the offset cancelling arrangement described with respect to FIG. 7.

While the foregoing description has been with reference to active filters it is equally applicable to passive filters where the adjustment of resistors and/or capacitors is required to produce an accurately defined cut-off frequency.

What is claimed is:

1. An integrated electrical filter comprising at least one filter section, said filter section comprising at least one capacitor and at least one resistor coupled to an input terminal and an output terminal, switching means for forming a product of the resistance of the resistor and the capacitance of the capacitor, and a trimming circuit for operating the switching means to adjust said product of resistance and capacitance, characterised in that the trimming circuit comprises means for charging a further capacitor from a reference voltage source through a further resistor for a first period, means for removing the charge from the further capacitor in discrete increments of charge during a second period, means for counting the number of charge increments required to remove the charge accumulated on the further capacitor during the first period, and means for operating the switching means to adjust the capacitance of said at least one capacitor or the resistance of said at least one resistor in dependence on the number of charge increments counted.

2. A filter as claimed in claim 1, further comprising a clock signal coupled to a clock input of the counting means, characterised in that the first period is equal to $2^N$ periods of the clock signal, where N is an integer.

3. A filter as claimed in claim 2, characterised in that the second period is equal to $2^N+P$ periods of the clock signal, where P is an integer.

4. A filter as claimed in claim 3, characterised in that the means for counting the number of charge increments comprises a binary counter stepped by said clock signal.

5. A filter as claimed in claim 4, characterised in that said further capacitor forms part of an integrator with an output of the integrator coupled to a register so as to cause the counter output to be read into register when the charge has been removed from the further capacitor.

6. A filter as claimed in claim 2, characterised in that said further capacitor forms part of an integrator with an output of the integrator coupled to the counting means thereby to inhibit further counting of the clock signal by the counting means.

7. A filter as claimed in claim 3, wherein said switching means comprise N switches, said at least one capacitor comprises a first capacitor and N associated capacitors each of which is connected in parallel with the first capacitor via an associated switch, and wherein the operating means are responsive to the counting means for controlling the associated switches.

8. A filer as claimed in claim 2, wherein said switching means comprises N switches, said at least one resistor comprises a first resistor and N associated resistors with each of the N associated resistors having an associated switch to enable it to be selectively connected in series with the first resistor, and wherein the operating means are responsive to the counting means for controlling the associated switches.

9. A filter as claimed in claim 2, characterised in that the means for removing the charge from the further capacitor comprises a switched capacitor which is oppositely charged from said reference voltage source in a first part of each cycle of a clock signal and whose charge is transferred to the further capacitor in a second part of each cycle of the clock signal, the first and second parts being non-overlapping.

10. A filter as claimed in claim 5 further comprising means for comparing a current state of the counter with that stored in the register in previous cycle, second means for comparing the voltage across the further capacitor with a first reference voltage when the current state of the counter is not equal to that stored in the register and for comparing the voltage across the further capacitor with a second reference voltage when the current state of the counter is equal to that stored in the register.

11. A filter as claimed in claim 5, characterised in that the integrator comprises a differential amplifier having an offset voltage switched in sign between the first and second periods.

12. A filter as claimed in claim 2 wherein said switching means comprises N switches and said at least one capacitor comprises a first capacitor and N associated capacitors with each of the N associated capacitors connected in parallel with the first capacitor via an associated one of said switches, and wherein the operating means are responsive to the counting means for controlling the associated switches.

13. A filter as claimed in claim 5 wherein said switching means comprises N switches and said at least one capacitor comprises a first capacitor and N associated capacitors with each of the N associated capacitors connected in parallel with the first capacitor via an associated one of said switches, and wherein the operating means are responsive to the counter for controlling the associated switches.

14. A filter as claimed in claim 3 wherein said switching means comprises N switches and said at least one resistor comprises a first resistor and N associated resistors with each of the N associated resistors having an associated switch to enable it to be selectively connected in series with the first resistor, and wherein the operating means are responsive to the counting means for controlling the associated switches.

15. A filter as claimed in claim 3 wherein the means for removing the charge from the further capacitor comprises a switched capacitor which is oppositely charged from said reference voltage source in a first part of each cycle of the clock signal and whose charge is transferred to the further capacitor in a second part of each cycle of the clock signal, the first and second parts being non-overlapping.

16. A filter as claimed in claim 2 wherein, said further capacitor forms part of an integrator with an output of the integrator coupled to the counting means so as to cause an output of the counting means to be read into a register when the charge has been removed from the further capacitor, and the means for removing the charge from the further capacitor comprises a switched capacitor which is oppositely charged from said reference voltage source in a first part of each cycle of a clock signal and whose charge is transferred to the further capacitor in a second part of each cycle of the clock signal, the first and second parts being non-overlapping.

17. A filter as claimed in claim 5 further comprising, means for comparing a current state of the counter with that stored in a register in a previous cycle, second means for comparing the voltage across the further capacitor with a first reference voltage when the current state of the counter is not equal to that stored in the register and for comparing the voltage across the further capacitor with a second reference voltage when the current state of the counter is equal to that stored in the register.

18. A filter as claimed in claim 3 wherein the counting means comprises a binary counter incremented by the clock signal and said further capacitor forms part of an integrator with an output of the integrator coupled to the counter so as to cause an output of the counter to be read into a register when the charge has been removed from the further capacitor, the integrator being arranged to inhibit further counting of the clock signal by the counter, and characterized in that the integrator comprises a differential amplifier having an offset voltage switched in polarity between the first and second periods.

19. A filter as claimed in claim 1 wherein said further capacitor is connected between an output and an inverting input of a differential amplifier having a non-inverting input coupled to a point of reference potential, second switching means for selectively coupling a second capacitor to said inverting input and to said reference voltage source in a manner whereby the second capacitor removes said charge from the further capacitor in discrete increments of charge, said differential amplifier and further capacitor forming an integrator, and gating means coupling the integrator output to the counting means to determine the number of charge increments required to discharge said further capacitor.

* * * * *